(12) United States Patent
Kuan et al.

(10) Patent No.: US 7,843,047 B2
(45) Date of Patent: Nov. 30, 2010

(54) ENCAPSULANT INTERPOSER SYSTEM WITH INTEGRATED PASSIVE DEVICES AND MANUFACTURING METHOD THEREFOR

(75) Inventors: Heap Hoe Kuan, Singapore (SG); Rui Huang, Singapore (SG); Yaojian Lin, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/276,297

(22) Filed: Nov. 21, 2008

(65) Prior Publication Data

US 2010/0127361 A1 May 27, 2010

(51) Int. Cl.
*H01L 23/495* (2006.01)

(52) U.S. Cl. .................. 257/676; 257/667; 257/670; 257/672; 257/686; 257/690; 257/691; 257/692; 257/693; 257/723; 257/724; 257/735; 257/773; 257/778

(58) Field of Classification Search .............. 257/667, 257/670, 672, 676, 686, 690–693, 723–724, 257/735, 773, 778
See application file for complete search history.

(56) References Cited

U.S. PATENT DOCUMENTS

| | | | |
|---|---|---|---|
| 6,421,013 B1 | 7/2002 | Chung | |
| 6,611,055 B1 | 8/2003 | Hashemi | |
| 6,621,140 B1 | 9/2003 | Gibson et al. | |
| 6,713,836 B2 * | 3/2004 | Liu et al. | 257/528 |
| 6,765,284 B2 | 7/2004 | Gibson et al. | |
| 6,927,481 B2 | 8/2005 | Gibson et al. | |
| 6,982,479 B2 | 1/2006 | Nishijima et al. | |
| 7,071,535 B2 | 7/2006 | Koo et al. | |
| 7,187,061 B2 | 3/2007 | Behzad | |
| 7,235,871 B2 * | 6/2007 | Corisis | 257/686 |
| 7,354,800 B2 * | 4/2008 | Carson | 438/109 |
| 7,550,832 B2 * | 6/2009 | Weng et al. | 257/685 |
| 7,692,931 B2 * | 4/2010 | Chong et al. | 361/790 |
| 2007/0176287 A1 | 8/2007 | Crowley et al. | |
| 2008/0185719 A1 * | 8/2008 | Cablao et al. | 257/738 |
| 2008/0272486 A1 * | 11/2008 | Wang et al. | 257/737 |

* cited by examiner

*Primary Examiner*—Kevin M Picardat
*Assistant Examiner*—Bac H Au
(74) *Attorney, Agent, or Firm*—Mikio Ishimaru

(57) ABSTRACT

A method of manufacturing a semiconductor package system including: forming a leadframe having a passive device; encapsulating the passive device to form an encapsulant interposer; attaching a first die to the encapsulant interposer; forming a substrate interposer having a second die; and stacking the encapsulant interposer over the substrate interposer.

7 Claims, 14 Drawing Sheets

ENCAPSULANT INTERPOSER SYSTEM WITH INTEGRATED PASSIVE DEVICES AND MANUFACTURING METHOD THEREFOR

TECHNICAL FIELD

The present invention relates generally to semiconductor packages, and more particularly to a system for a semiconductor package having an encapsulant interposer with integrated passive devices.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which these integrated semiconductor chips are mounted include a substrate or other chip-mounting device. One example of such a substrate is a leadframe. Leadframes typically include an area on which an integrated circuit chip is mounted and multiple power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art. The power, ground and/or signal sites on the chip may then be electrically connected to individual leads of the leadframe through techniques such as wire bonding.

An interposer is an electrical interface routing between one socket or connection to another. It is an intermediate layer often used for interconnection routing or as a ground/power plane. When multiple chips are mounted within the same semiconductor package, routing problems may arise due to the different routing design of each individual chip. To solve this problem, an interposer is often used. Sometimes the terms 'substrate' and 'interposer' are used to refer to the same thing.

Leadframes have been used extensively in the integrated circuit packaging industry mainly because of their low manufacturing cost and high reliability. Leadframe packages remain a cost-effective solution for packaging integrated circuits and in recent years certain variations of leadframes such as leadless packages also emerge as improvements.

Conventional leadframes include a die pad, surrounded by a number of leads. An integrated circuit chip is attached to the die pad using a conductive adhesive such as silver epoxy. The conductive adhesive is cured after die attach. After the die is attached to the die pad, a wire-bonding process is typically used to make electrical interconnections between the integrated circuit and the leads of the leadframe. After wire bonding, the leadframe with the integrated circuit attached is encapsulated using a mold compound.

Such enclosures may include encapsulant in a plastic or a multi-part housing made of plastic, ceramic, or metal. The enclosure protects the leadframe and the attached chip from physical, electrical, and/or chemical damage. Finally, post mold curing and singulation steps are conducted to complete the packaging process.

The leadframe and attached chip(s) may then be mounted on, for example, a circuit board, or card along with other leadframes or devices. The circuit board or card may then be incorporated into a wide variety of devices such as computers, automobiles, and appliances, among others.

A problem with the conventional leadframes is that the die pad and the leads of the leadframe occupy space of the semiconductor package that is not occupied by the attached semiconductor chip, resulting in reduced chip packaging density. As integrated circuits have become smaller with increased performance requirements, enhancing packaging density becomes more and more important.

Another problem with the conventional leadframes is that it does not include many desirable passive devices, such as inductors, capacitors, and resisters, for a semiconductor package. The modern trend of integrated circuits has been that more and more functionalities, including passive device functionalities, are integrated into one single package.

Thus, a need still remains for increasing the packaging density of the leadframe design and adding passive devices to the leadframes. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing a semiconductor package system including: forming a leadframe having a passive device; encapsulating the passive device to form an encapsulant interposer, attaching a first die to the encapsulant interposer; forming a substrate interposer having a second die; and stacking the encapsulant interposer over the substrate interposer.

The present invention provides a semiconductor package system including: an encapsulant interposer having a passive device encapsulated; a first die connected to the encapsulant interposer; and a substrate interposer having a second die, the encapsulant interposer being stacked over the substrate interposer.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
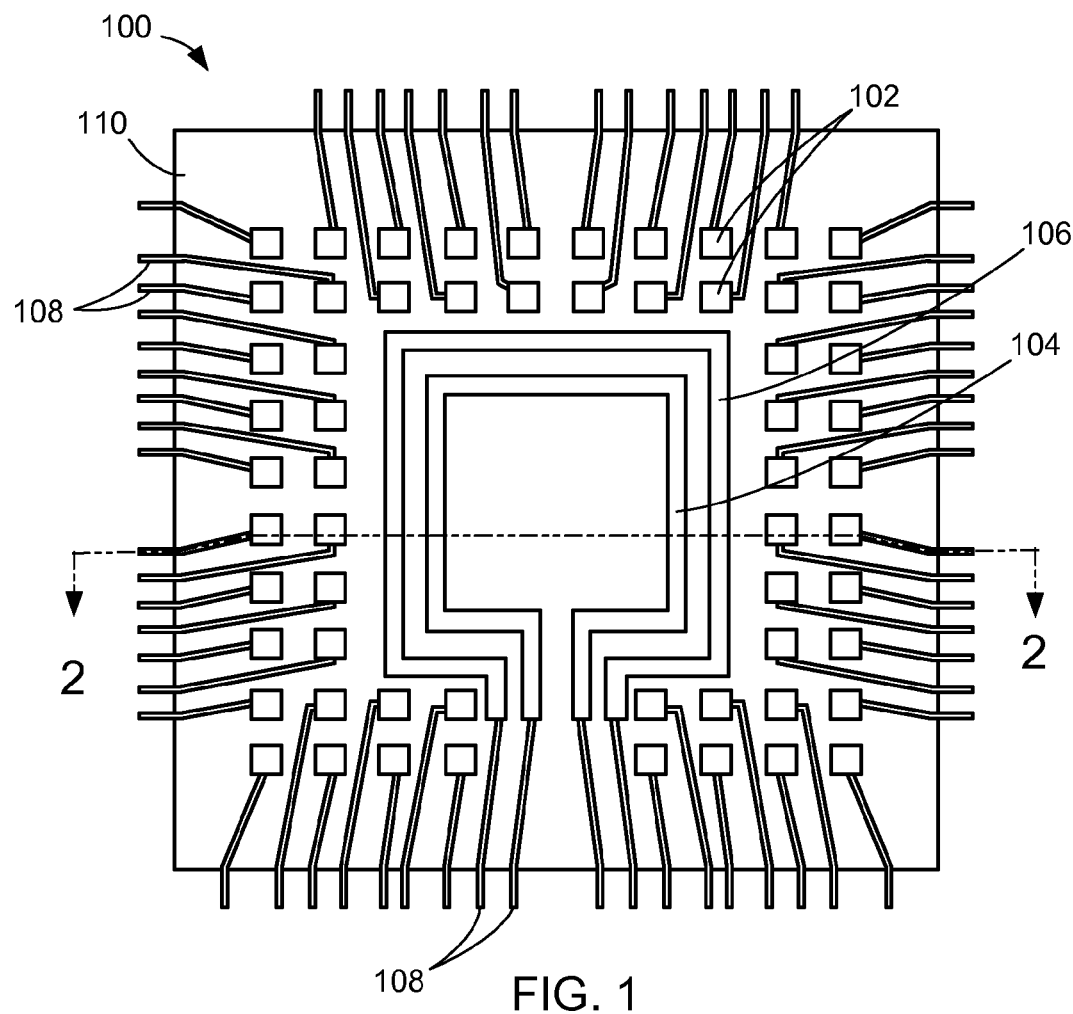
FIG. 1 is a top view of an encapsulant interposer of a first embodiment of the present invention after a stage of singulation.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. Likewise, the drawings showing embodiments of the system are semi-diagrammatic and not to scale and, particularly, some of the dimensions are for the clarity of presentation and are shown exaggerated in the drawings. Also, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "coplanar" is defined as being in the same plane or flat. With regard to an unfinished leadframe the term means that the unfinished leadframe is in one plane and flat as contrasted with having different heights.

Referring now to FIG. 1, therein is shown a top view of an encapsulant interposer 100 of a first embodiment of the present invention after a stage of singulation.

An encapsulant interposer 100 is shown. The encapsulant interposer 100 has a contact pad 102, a first inductor 104, a second inductor 106, and an external contact terminal 108. The contact pad 102 is connected to the external contact terminal 108. The first inductor 104 and the second inductor 106 are also connected to the external contact terminal 108.

The contact pad 102, the first inductor 104, and the second inductor 106 are encapsulated in a mold compound 110.

In the current embodiment of the present invention, the first inductor 104 and the second inductor 106, both of which are passive devices, are included in the encapsulant interposer 100. It has been discovered that such a configuration saves space that is reserved for such passive devices in conventional semiconductor packages, resulting in denser and more compact semiconductor packages. Furthermore, since the inclusion of the inductors in the encapsulant interposer makes the manufacturing process of semiconductor packages having such passive devices much simpler than the convention manufacturing process, it has also been discovered that such a configuration reduces the cost of manufacturing process. It has further been discovered that the inductor performance in this configuration is improved compared to inductors in conventional semiconductor packages because the inductors are protected from leakage due to the encapsulation by the mold compound 110.

Figure 2:
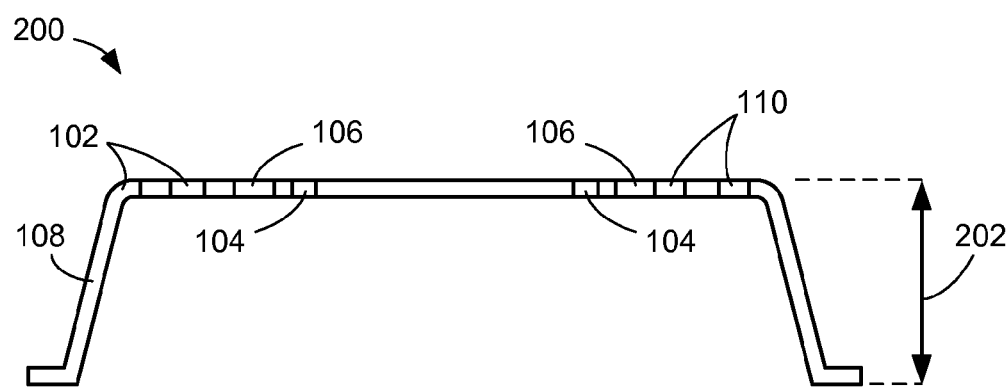
FIG. 2 is a cross-sectional view of the encapsulant interposer of the first embodiment of the present invention along line 2-2 of FIG. 1.

Referring now to FIG. 2, therein is shown a cross-sectional view of the encapsulant interposer 100 of the first embodiment of the present invention along line 2-2 of FIG. 1.

The external contact terminal 108 is not coplanar with the contact pad 102. The external contact terminal 108 bends downward and is not horizontal. A standoff height 202 is created between one end of the external contact terminal 108 and the contact pad 102 in the vertical direction.

The mold compound 110 provides mechanical support to the first inductor 104, the second inductor 106, and the devices that would be put upon the encapsulant interposer later on. In the current embodiment of the present invention, both the top and the bottom surfaces of the first inductor 104 and the second inductor 106 are exposed.

Figure 3:
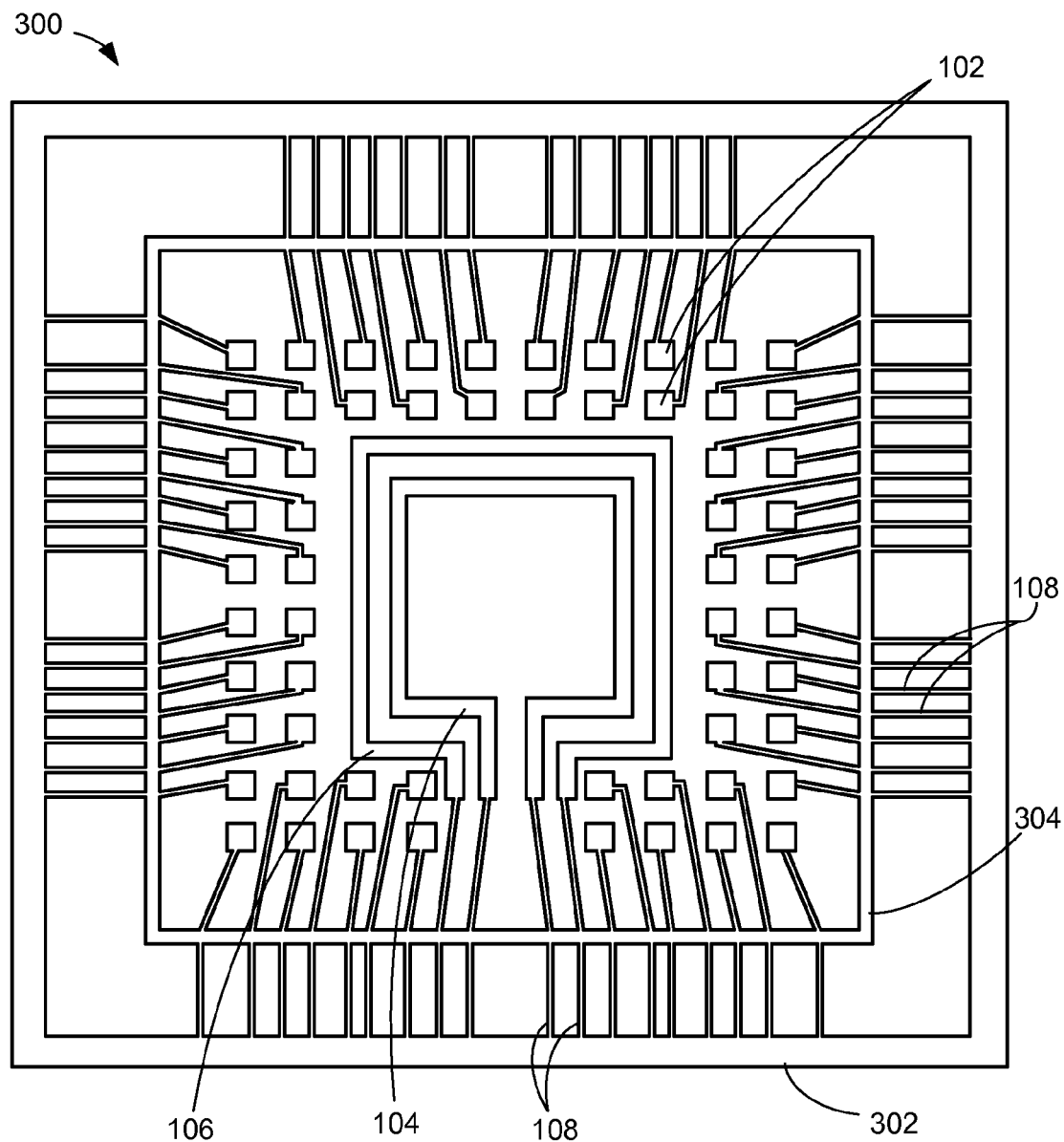
FIG. 3 is a top view of a leadframe of the first embodiment of the present invention after a first intermediate stage of the process.

Referring now to FIG. 3, therein is shown a top view of a leadframe 300 of the first embodiment of the present invention after a first intermediate stage of the process.

The leadframe 300 is shown. The leadframe 300 has the contact pad 102, the first inductor 104, the second inductor 106, the external contact terminal 108, a first dam bar 302, and a second dam bar 304.

The contact pad 102 is connected to the external contact terminal 108 and to the second dam bar 304. The first inductor 104 and the second inductor 106 are also connected to the external contact terminal 108 and to the second dam bar 304. The external contact terminal 108 is connected to the first dam bar 302 at one end and to the second dam bar 304 at the other end.

The leadframe 300 could be pre-plated with one or more metal layers such as Ni, Au, Pt, etc.

Figure 4:
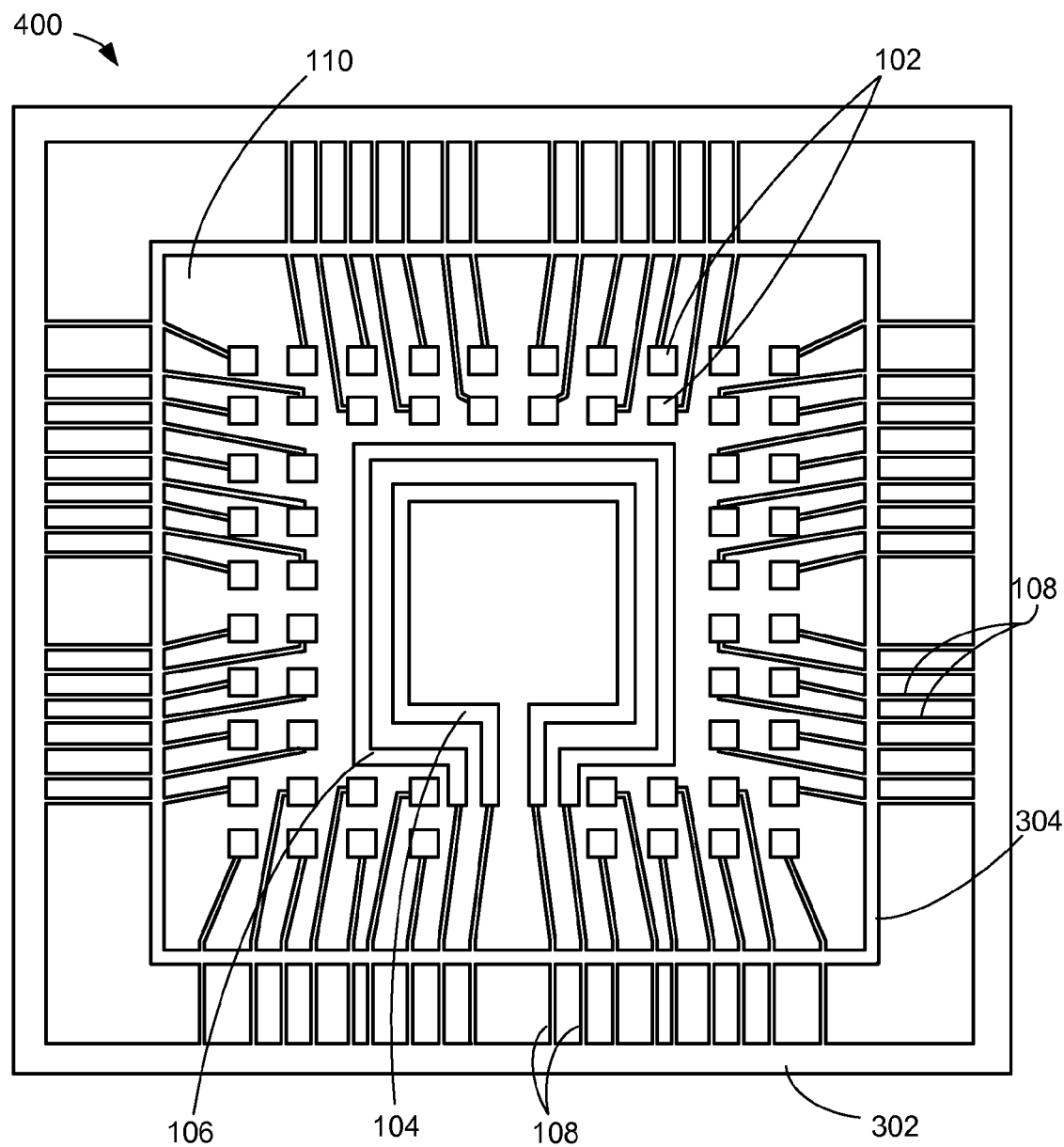
FIG. 4 is a top view of an unfinished encapsulant interposer of the first embodiment of the present invention after a second intermediate stage of the process.

Referring now to FIG. 4, therein is shown a top view of an unfinished encapsulant interposer 400 of the first embodiment of the present invention after a second intermediate stage of the process.

The contact pad 102, the first inductor 104, and the second inductor 106 are encapsulated in the mold compound 110.

Figure 5:
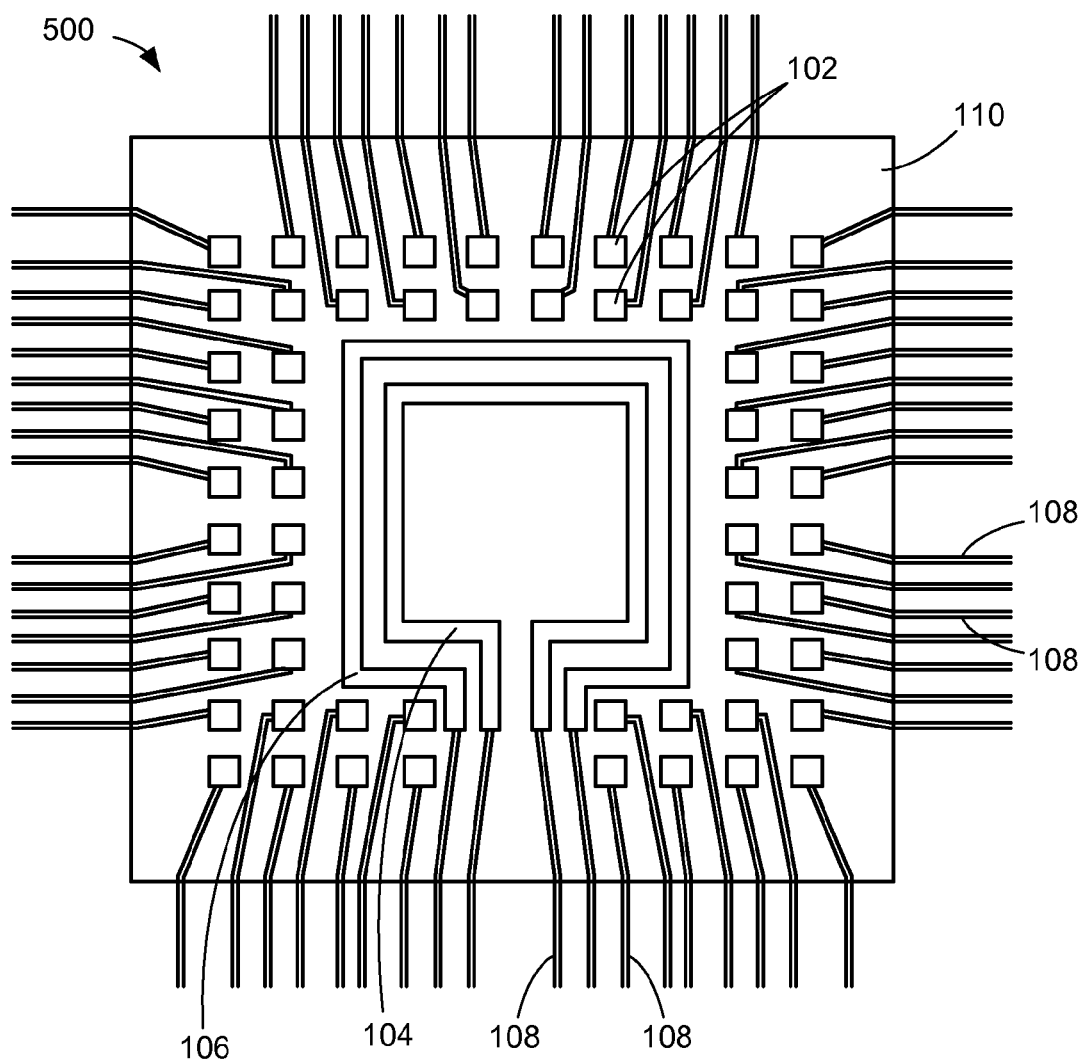
FIG. 5 is a top view of an unfinished encapsulant interposer of the first embodiment of the present invention after a third intermediate stage of the process.

Referring now to FIG. 5, therein is shown a top view of an unfinished encapsulant interposer 500 of the first embodiment of the present invention after a third intermediate stage of the process.

The first dam bar 302 and the second dam bar 304 in FIG. 4 are removed by a process of singulation.

The external contact terminal 108 is then trimmed and formed to a predetermined shape. The encapsulant interposer 100 is thus formed. Although the external contact terminal 108 is shown to bend downward in FIG. 2, it should be understood that one or more of them can be bent to any shape to facilitate further interconnection.

Figure 6:
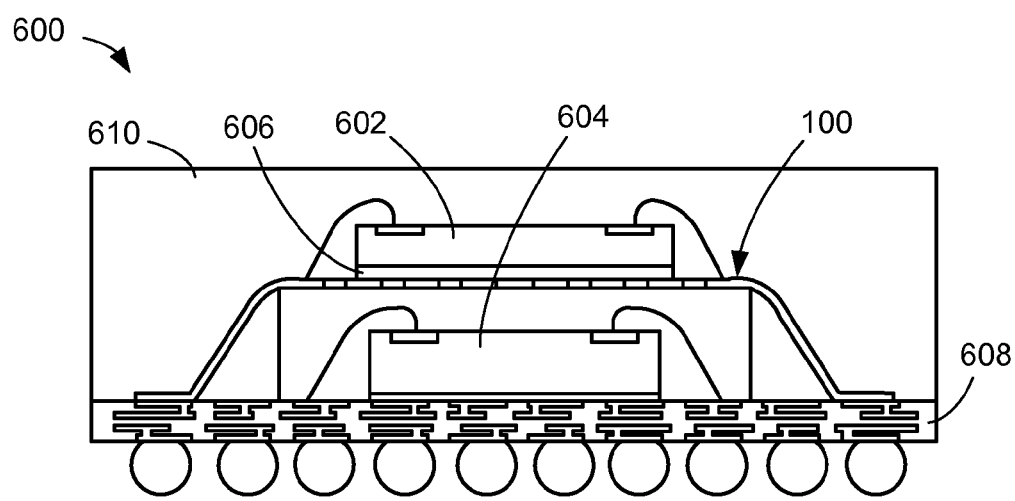
FIG. 6 is a cross-sectional view of a semiconductor package of a second embodiment of the present invention after a stage of singulation.

Referring now to FIG. 6, therein is shown a cross-sectional view of a semiconductor package 600 of a second embodiment of the present invention after a stage of singulation.

The semiconductor package 600 has a first die 602 and a second die 604. The semiconductor package 600 also has the encapsulant interposer 100 embedded. The first die 602 is attached to the encapsulant interposer 100 through a die paste 606. The second die 604 is underneath the encapsulant interposer 100 and is attached to a substrate interposer 608. The encapsulant interposer 100, the first die 602, the second die 604, and the die paste 606 are encapsulated in a package mold compound 610.

In the current embodiment of the present invention, the encapsulant interposer 100 is used as an internal stacking module of the semiconductor package 600. It has been discovered that such a configuration reduces the thickness of the semiconductor package 600, resulting in thinner profile of such packages.

Figure 7:
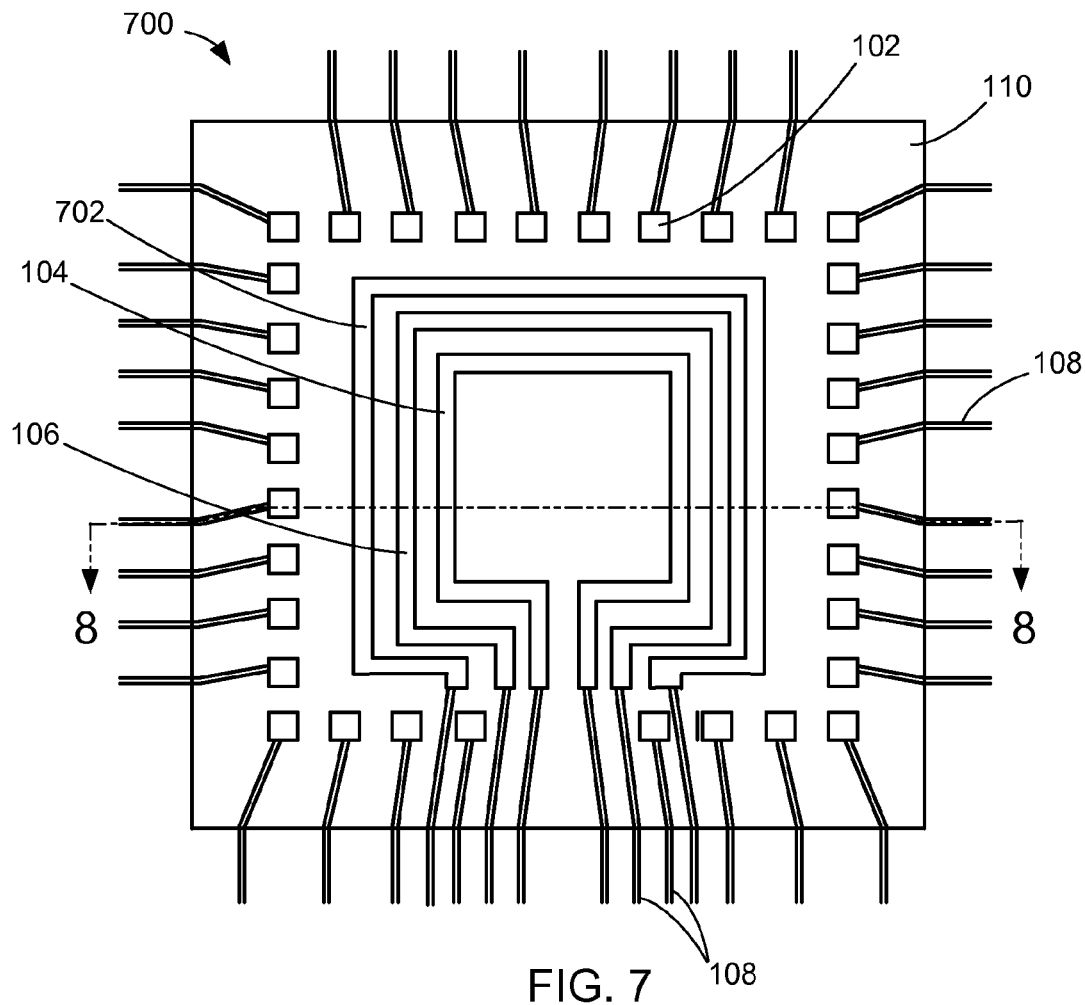
FIG. 7 is a top view of an encapsulant interposer of a third embodiment of the present invention after a stage of singulation.

Referring now to FIG. 7, therein is shown a top view of an encapsulant interposer 700 of a third embodiment of the present invention after a stage of singulation.

An encapsulant interposer 700 is shown. The encapsulant interposer 700 has the contact pad 102, the first inductor 104, the second inductor 106, a third inductor 702, and the external contact terminal 108. The contact pad 102 is connected to the external contact terminal 108. The first inductor 104, the second inductor 106, and the third inductor 702 are also connected to the external contact terminal 108.

The contact pad 102, the first inductor 104, the second inductor 106, and the third inductor 702 are encapsulated in the mold compound 110.

Compared to the encapsulant interposer 100 of FIG. 1, where the encapsulant interposer 100 has two rows of the contact pad 102, the current embodiment of the present invention has one row of the contact pad 102. The encapsulant interposer could have more than two rows of the contact pad 102.

In the current embodiment of the present invention, the first inductor 104, the second inductor 106, and the third inductor 702, all of which are passive devices, are included in the encapsulant interposer 700. It has been discovered that such a configuration saves space that is reserved for such passive devices in conventional semiconductor packages, resulting in denser and more compact semiconductor packages. Furthermore, since the inclusion of the inductors in the encapsulant interposer makes the manufacturing process of semiconductor packages having such passive devices much simpler than the convention manufacturing process, it has also been discovered that such a configuration reduces the cost of manufacturing process. It has further been discovered that the inductor performance in this configuration is improved compared to inductors in conventional semiconductor packages because the inductors are protected from leakage due to the encapsulation by the mold compound 110.

Figure 8:
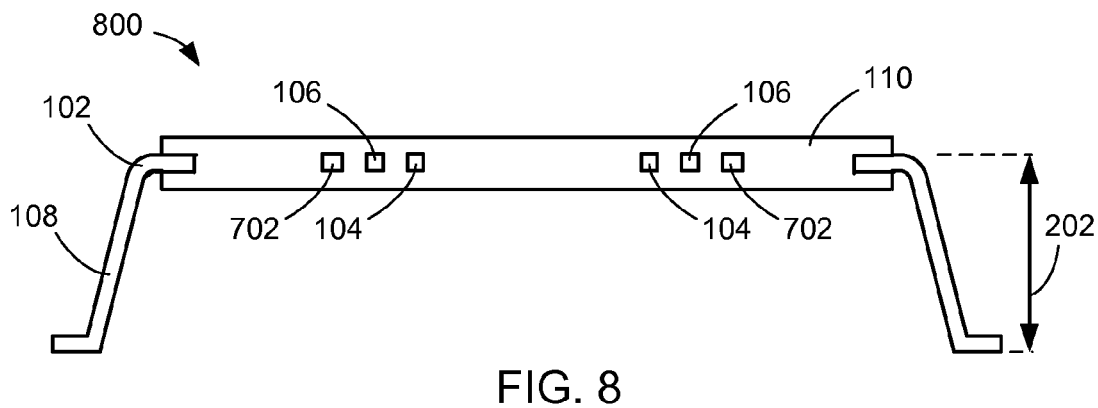
FIG. 8 is a cross-sectional view similar to FIG. 2 of the encapsulant interposer of the third embodiment of the present invention along line 8-8 of FIG. 7.

Referring now to FIG. 8, therein is shown a cross-sectional view similar to FIG. 2 of the encapsulant interposer 700 of the third embodiment of the present invention along line 8-8 of FIG. 7.

The external contact terminal 108 is not coplanar with the contact pad 102. The external contact terminal 108 bends downward and is not horizontal. The standoff height 202 is created between one end of the external contact terminal 108 and the contact pad 102 in the vertical direction.

The mold compound 110 provides mechanical support to the first inductor 104, the second inductor 106, the third inductor 702, and the devices that would be put upon the encapsulant interposer later on.

Figure 9:
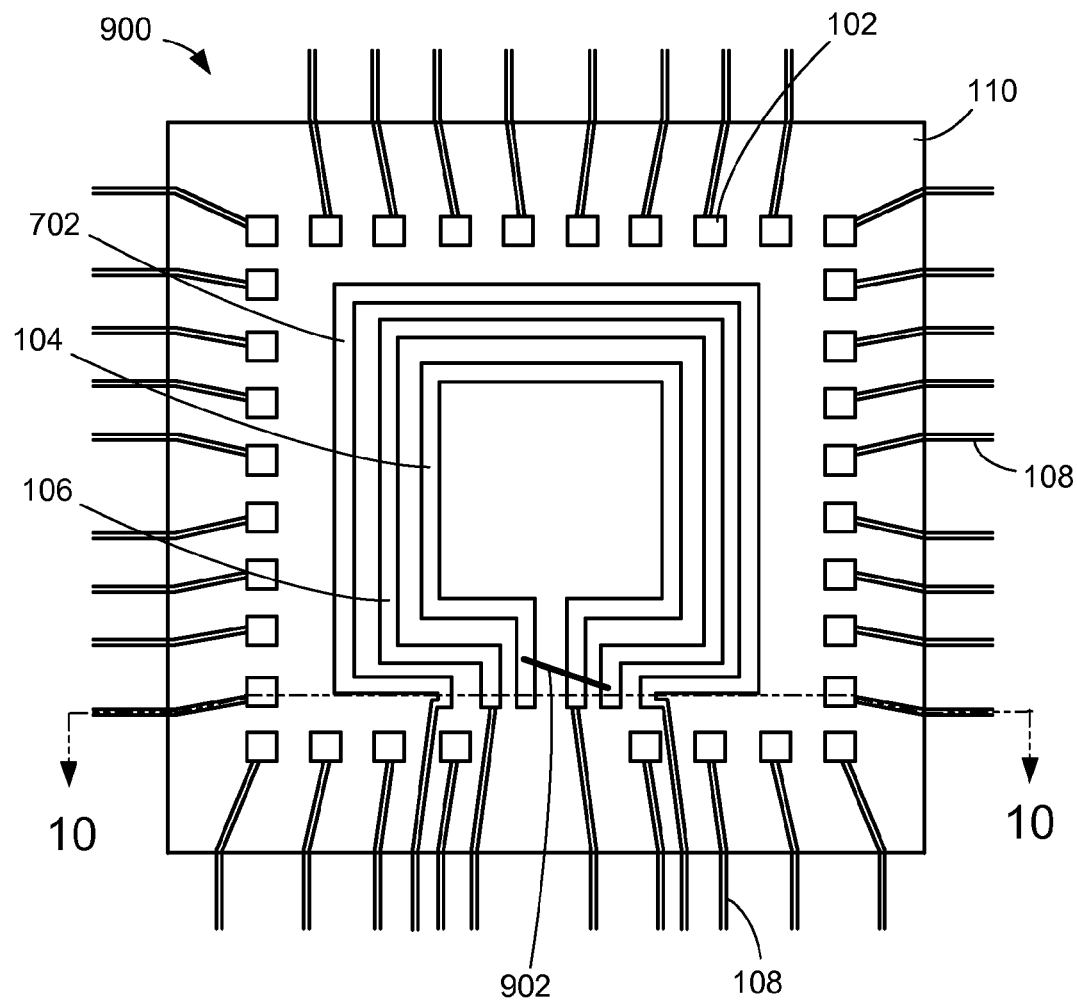
FIG. 9 is a top view of an encapsulant interposer of a fourth embodiment of the present invention after a stage of singulation.

Referring now to FIG. 9, therein is shown a top view of an encapsulant interposer 900 of a fourth embodiment of the present invention after a stage of singulation.

An encapsulant interposer 900 is shown. The encapsulant interposer 900 has the contact pad 102, the first inductor 104, the second inductor 106, the third inductor 702, and the external contact terminal 108. The contact pad 102 is connected to the external contact terminal 108. The first inductor 104, the second inductor 106, and the third inductor 702 are also connected to the external contact terminal 108.

The first inductor 104 and the second inductor 106 are interconnected through a jumper wire 902. Such an interconnection effectively puts the first inductor 104 and the second inductor 106 in serial positions and results in a new inductor with approximately double the inductance of each individual inductor.

The contact pad 102, the first inductor 104, the second inductor 106, the third inductor 702, and the jumper wire 902 are encapsulated in the mold compound 110.

Compared to the encapsulant interposer 100 of FIG. 1, where the encapsulant interposer 100 has two rows of the contact pad 102, the current embodiment of the present invention has one row of the contact pad 102. The encapsulant interposer could have more than two rows of the contact pad 102. Also, other combinations of the inductors could be interconnected by the jumper wire 902.

In the current embodiment of the present invention, the first inductor 104, the second inductor 106, and the third inductor 702, all of which are passive devices, are included in the encapsulant interposer 900. It has been discovered that such a configuration saves space that is reserved for such passive devices in conventional semiconductor packages, resulting in denser and more compact semiconductor packages. Furthermore, since the inclusion of the inductors in the encapsulant interposer makes the manufacturing process of semiconductor packages having such passive devices much simpler than the convention manufacturing process, it has also been discovered that such a configuration reduces the cost of manufacturing process. It has further been discovered that the inductor performance in this configuration is improved compared to inductors in conventional semiconductor packages because the inductors are protected from leakage due to the encapsulation by the mold compound 110.

Figure 10:
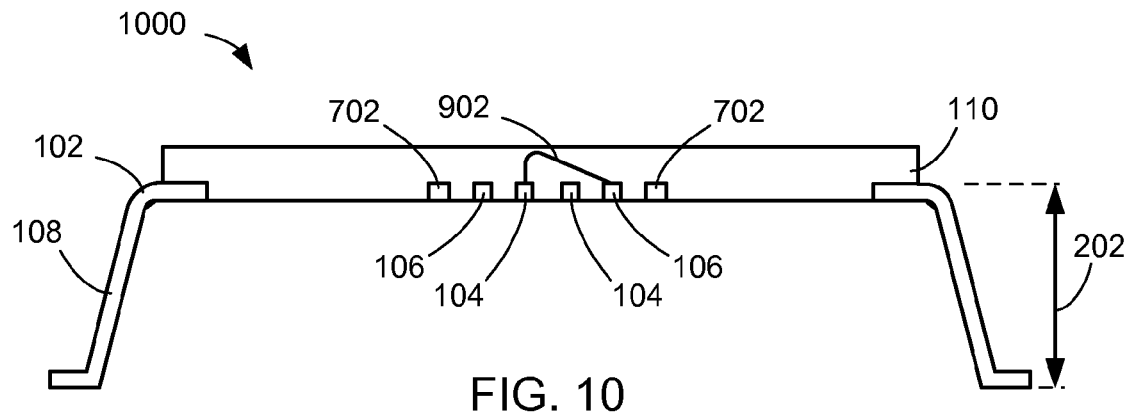
FIG. 10 is a cross-sectional view similar to FIG. 2 of the encapsulant interposer of the fourth embodiment of the present invention along line 10-10 of FIG. 9.

Referring now to FIG. 10, therein is shown a cross-sectional view similar to FIG. 2 of the encapsulant interposer 900 of the fourth embodiment of the present invention along line 10-10 of FIG. 9.

The external contact terminal 108 is not coplanar with the contact pad 102. The external contact terminal 108 bends downward and is not horizontal. The standoff height 202 is created between one end of the external contact terminal 108 and the contact pad 102 in the vertical direction.

The mold compound 110 provides mechanical support to the first inductor 104, the second inductor 106, the third inductor 702, and the devices that would be put upon the encapsulant interposer later on. The mold compound 110 also protects the jumper wire 902. In the current embodiment of the present invention, the bottom surfaces of the first inductor 104, the second inductor 106, and the third inductor 702 are exposed.

Figure 11:
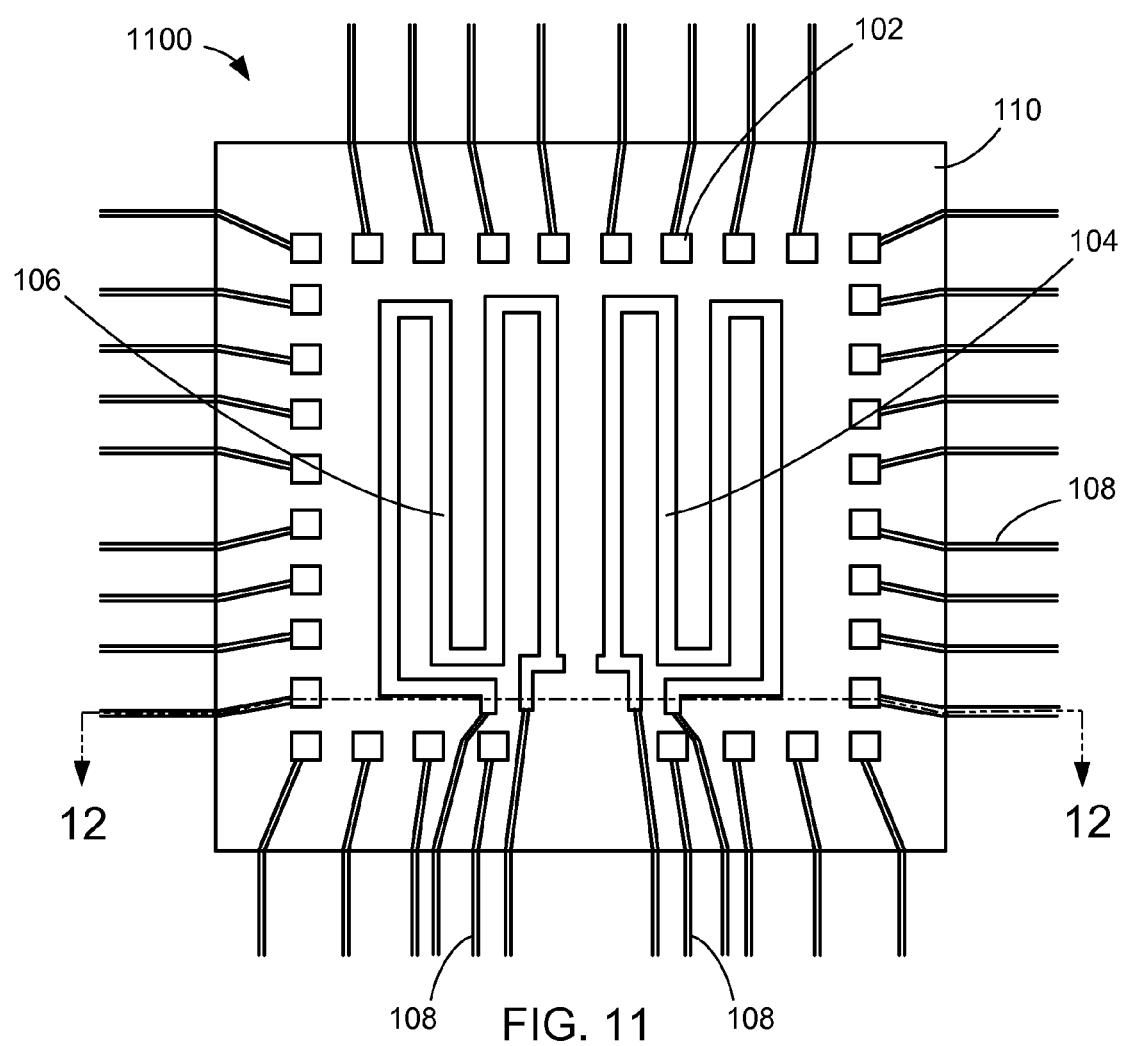
FIG. 11 is a top view of an encapsulant interposer of a fifth embodiment of the present invention after a stage of singulation.

Referring now to FIG. 11, therein is shown a top view of an encapsulant interposer 1100 of a fifth embodiment of the present invention after a stage of singulation.

An encapsulant interposer 1100 is shown. The encapsulant interposer 1100 has the contact pad 102, the first inductor 104, the second inductor 106, and the external contact terminal 108. The contact pad 102 is connected to the external contact terminal 108. The first inductor 104 and the second inductor 106 are also connected to the external contact terminal 108.

Compared to the encapsulant interposer 100 of FIG. 1, where the first inductor 104 is partially encircled by the second inductor 106, the current embodiment of the present invention has the first inductor 104 and the second inductor 106 side by side. The exact positioning of the first inductor 104 and the second inductor 106 does not necessarily have to be symmetrical and can be offset.

The contact pad 102, the first inductor 104, and the second inductor 106 are encapsulated in the mold compound 110.

Compared to the encapsulant interposer 100 of FIG. 1, where the encapsulant interposer 100 has two rows of the contact pad 102, the current embodiment of the present invention has one row of the contact pad 102. The encapsulant interposer could have more than two rows of the contact pad 102.

In the current embodiment of the present invention, the first inductor 104 and the second inductor 106, both of which are passive devices, are included in the encapsulant interposer 1100. It has been discovered that such a configuration saves space that is reserved for such passive devices in conventional semiconductor packages, resulting in denser and more compact semiconductor packages. Furthermore, since the inclusion of the inductors in the encapsulant interposer makes the manufacturing process of semiconductor packages having such passive devices much simpler than the convention manufacturing process, it has also been discovered that such a configuration reduces the cost of manufacturing process. It has further been discovered that the inductor performance in this configuration is improved compared to inductors in conventional semiconductor packages because the inductors are protected from leakage due to the encapsulation by the mold compound 110.

Figure 12:
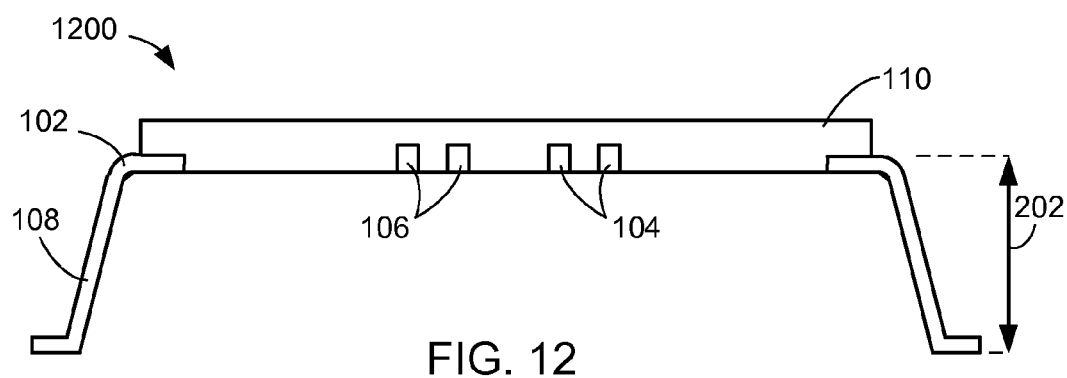
FIG. 12 is a cross-sectional view similar to FIG. 2 of the encapsulant interposer of the fifth embodiment of the present invention along line 12-12 of FIG. 1.

Referring now to FIG. 12, therein is shown a cross-sectional view similar to FIG. 2 of the encapsulant interposer 1100 of the fifth embodiment of the present invention along line 12-12 of FIG. 11.

The external contact terminal 108 is not coplanar with the contact pad 102. The external contact terminal 108 bends downward and is not horizontal. The standoff height 202 is created between one end of the external contact terminal 108 and the contact pad 102 in the vertical direction.

The mold compound 110 provides mechanical support to the first inductor 104, the second inductor 106, and the devices that would be put upon the encapsulant interposer later on. In the current embodiment of the present invention, the bottom surfaces of the first inductor 104 and the second inductor 106 are exposed.

Figure 13:
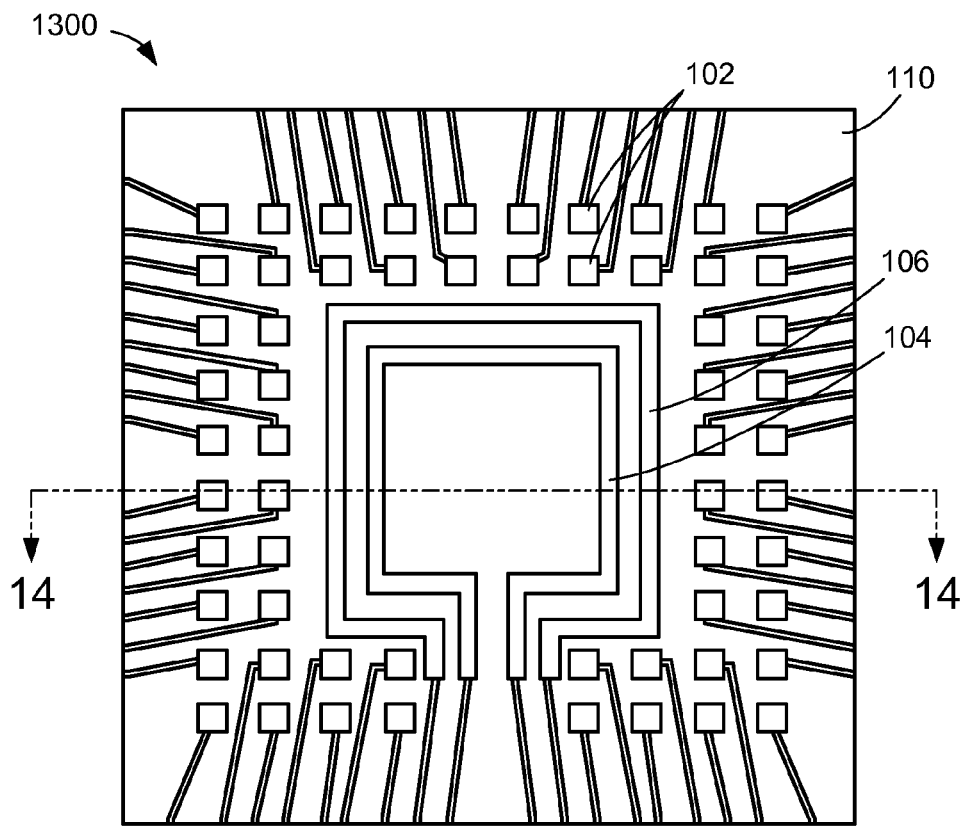
FIG. 13 is a top view of an encapsulant interposer of a sixth embodiment of the present invention after a stage of singulation.

Referring now to FIG. 13, therein is shown a top view of an encapsulant interposer 1300 of a sixth embodiment of the present invention after a stage of singulation.

An encapsulant interposer 1300 is shown. The encapsulant interposer 1300 has the contact pad 102, the first inductor 104, and the second inductor 106.

Compared to the encapsulant interposer 100 of FIG. 1, where there is the external contact terminal 108 of FIG. 1, the current embodiment of the present invention does not have the external contact terminal 108 of FIG. 1. This type of configuration is sometimes called a "leadless" configuration.

The contact pad 102, the first inductor 104, and the second inductor 106 are encapsulated in the mold compound 110.

In the current embodiment of the present invention, the first inductor 104 and the second inductor 106, both of which are passive devices, are included in the encapsulant interposer 1300. It has been discovered that such a configuration saves space that is reserved for such passive devices in conventional semiconductor packages, resulting in denser and more compact semiconductor packages. Furthermore, since the inclusion of the inductors in the encapsulant interposer makes the manufacturing process of semiconductor packages having such passive devices much simpler than the convention manufacturing process, it has also been discovered that such a configuration reduces the cost of manufacturing process. It has further been discovered that the inductor performance in this configuration is improved compared to inductors in conventional semiconductor packages because the inductors are protected from leakage due to the encapsulation by the mold compound 110.

Figure 14:
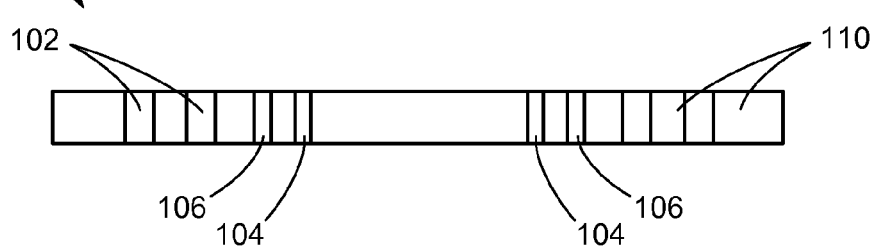
FIG. 14 is a cross-sectional view similar to FIG. 2 of the encapsulant interposer of the sixth embodiment of the present invention along line 14-14 of FIG. 13.

Referring now to FIG. 14, therein is shown a cross-sectional view similar to FIG. 2 of the encapsulant interposer 1300 of the sixth embodiment of the present invention along line 14-14 of FIG. 13.

Compared to the encapsulant interposer 100 of FIG. 1, where there is the external contact terminal 108 of FIG. 1, the current embodiment of the present invention does not have the external contact terminal 108 of FIG. 1 or FIG. 2. The standoff height 202 of FIG. 2 does not exist in the current embodiment of the present invention. The encapsulant interposer 1300 is flat.

The mold compound 110 provides mechanical support to the first inductor 104, the second inductor 106, and the devices that would be put upon the encapsulant interposer later on. In the current embodiment of the present invention, both the top and the bottom surfaces of the first inductor 104 and the second inductor 106 are exposed.

Figure 15:
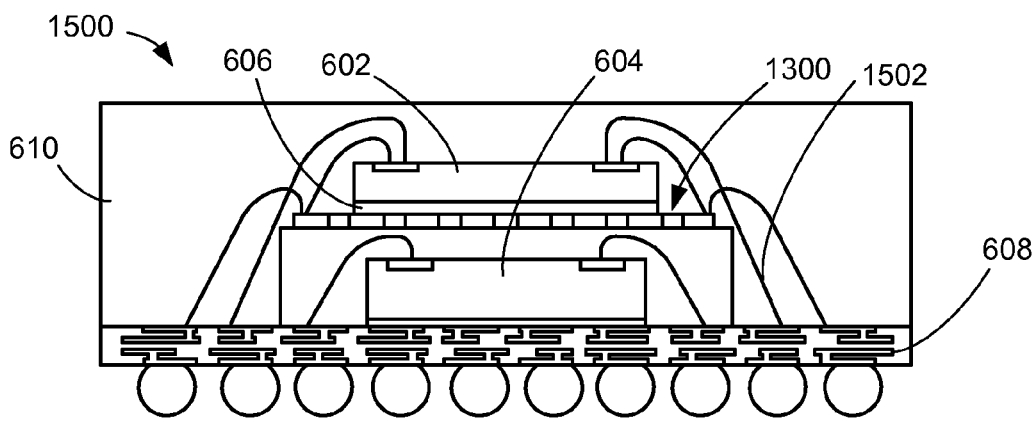
FIG. 15 is a cross-sectional view similar to FIG. 6 of a semiconductor package of a seventh embodiment of the present invention after a stage of singulation.

Referring now to FIG. 15, therein is shown a cross-sectional view similar to FIG. 6 of a semiconductor package 1500 of a seventh embodiment of the present invention after a stage of singulation.

The semiconductor package 1500 has the first die 602 and the second die 604. The semiconductor package 1500 also has the encapsulant interposer 1300 embedded. The first die 602 is attached to the encapsulant interposer 1300 through the die paste 606. The second die 604 is underneath the encapsulant interposer 1300 and is attached to the substrate interposer 608.

The first die 602 is also electrically connected to the substrate interposer 608 through a bonding wire 1502.

The encapsulant interposer 1300, the first die 602, the second die 604, and the die paste 606 are encapsulated in the package mold compound 610.

In the current embodiment of the present invention, the encapsulant interposer 1300 is used as an internal stacking module of the semiconductor package 1500. It has been discovered that such a configuration reduces the thickness of the semiconductor package 1500, resulting in thinner profile of such packages.

Figure 16:
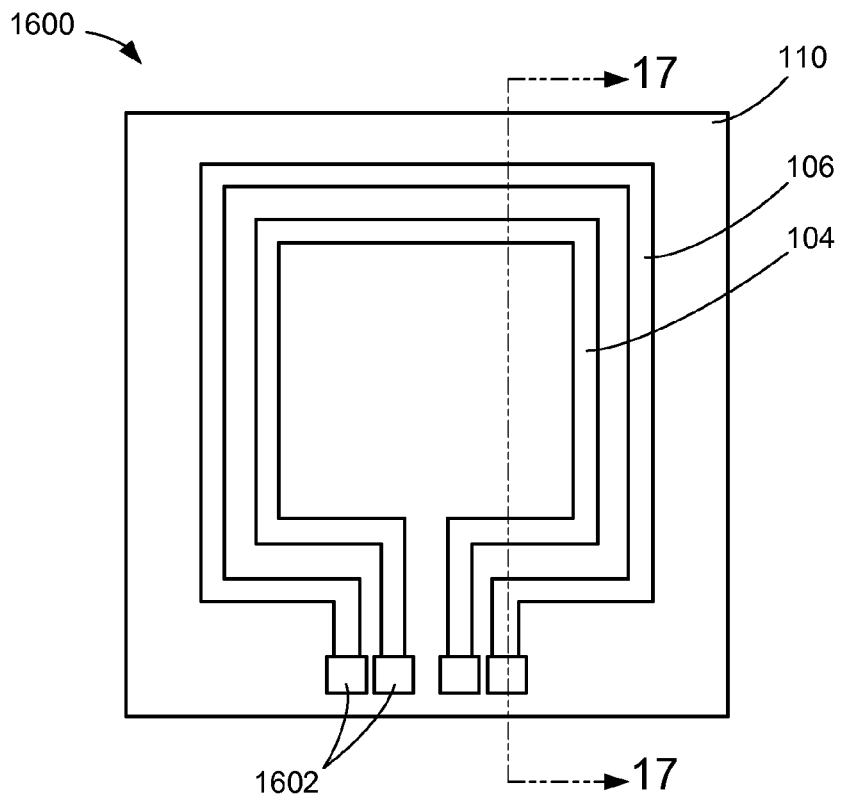
FIG. 16 is a top view of an encapsulant interposer of an eighth embodiment of the present invention after a stage of singulation.

Referring now to FIG. 16, therein is shown a top view of an encapsulant interposer 1600 of an eighth embodiment of the present invention after a stage of singulation.

An encapsulant interposer 1600 is shown. The encapsulant interposer 1600 has the first inductor 104, the second inductor 106, and an inductor pad 1602.

The first inductor 104, the second inductor 106, and the inductor pad 1602 are encapsulated in the mold compound 110.

In the current embodiment of the present invention, the first inductor 104 and the second inductor 106, both of which are passive devices, are included in the encapsulant interposer 1600. It has been discovered that such a configuration saves space that is reserved for such passive devices in conventional semiconductor packages, resulting in denser and more compact semiconductor packages. Furthermore, since the inclusion of the inductors in the encapsulant interposer makes the manufacturing process of semiconductor packages having such passive devices much simpler than the convention manufacturing process, it has also been discovered that such a configuration reduces the cost of manufacturing process. It has further been discovered that the inductor performance in this configuration is improved compared to inductors in conventional semiconductor packages because the inductors are protected from leakage due to the encapsulation by the mold compound 110.

Figure 17:
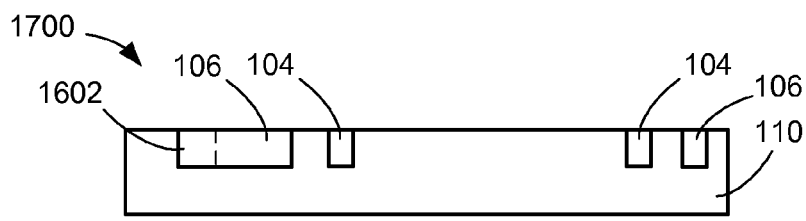
FIG. 17 is a cross-sectional view similar to FIG. 2 of the encapsulant interposer of the eighth embodiment of the present invention along line 17-17 of FIG. 16.

Referring now to FIG. 17, therein is shown a cross-sectional view similar to FIG. 2 of the encapsulant interposer 1600 of the eighth embodiment of the present invention along line 17-17 of FIG. 16.

Compared to the encapsulant interposer 100 of FIG. 1, where there is the external contact terminal 108 of FIG. 1, the current embodiment of the present invention does not have the external contact terminal 108 of FIG. 1 or FIG. 2. The standoff height 202 of FIG. 2 does not exist in the current embodiment of the present invention. The encapsulant interposer 1600 is flat.

The mold compound 110 provides mechanical support to the first inductor 104, the second inductor 106, and the devices that would be put upon the encapsulant interposer later on. In the current embodiment of the present invention, the top surfaces of the first inductor 104 and the second inductor 106 are exposed.

Figure 18:
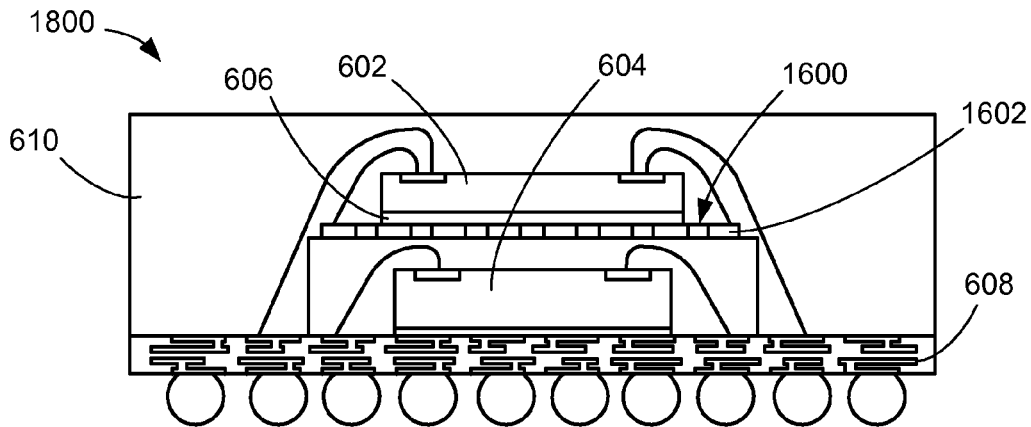
FIG. 18 is a cross-sectional view similar to FIG. 6 of a semiconductor package of a ninth embodiment of the present invention after a stage of singulation.

Referring now to FIG. 18, therein is shown a cross-sectional view similar to FIG. 6 of a semiconductor package 1800 of a ninth embodiment of the present invention after a stage of singulation.

The semiconductor package 1800 has the first die 602 and the second die 604. The semiconductor package 1800 also has the encapsulant interposer 1600 embedded. The first die 602 is attached to the encapsulant interposer 1600 through the die paste 606. The second die 604 is underneath the encapsulant interposer 1600 and is attached to the substrate interposer 608. The encapsulant interposer 1600 having the inductor pad 1602, the first die 602, the second die 604, and the die paste 606 are encapsulated in the package mold compound 610.

In the current embodiment of the present invention, the encapsulant interposer 1600 is used as an internal stacking module of the semiconductor package 1800. It has been discovered that such a configuration reduces the thickness of the semiconductor package 1800, resulting in thinner profile of such packages.

Figure 19:
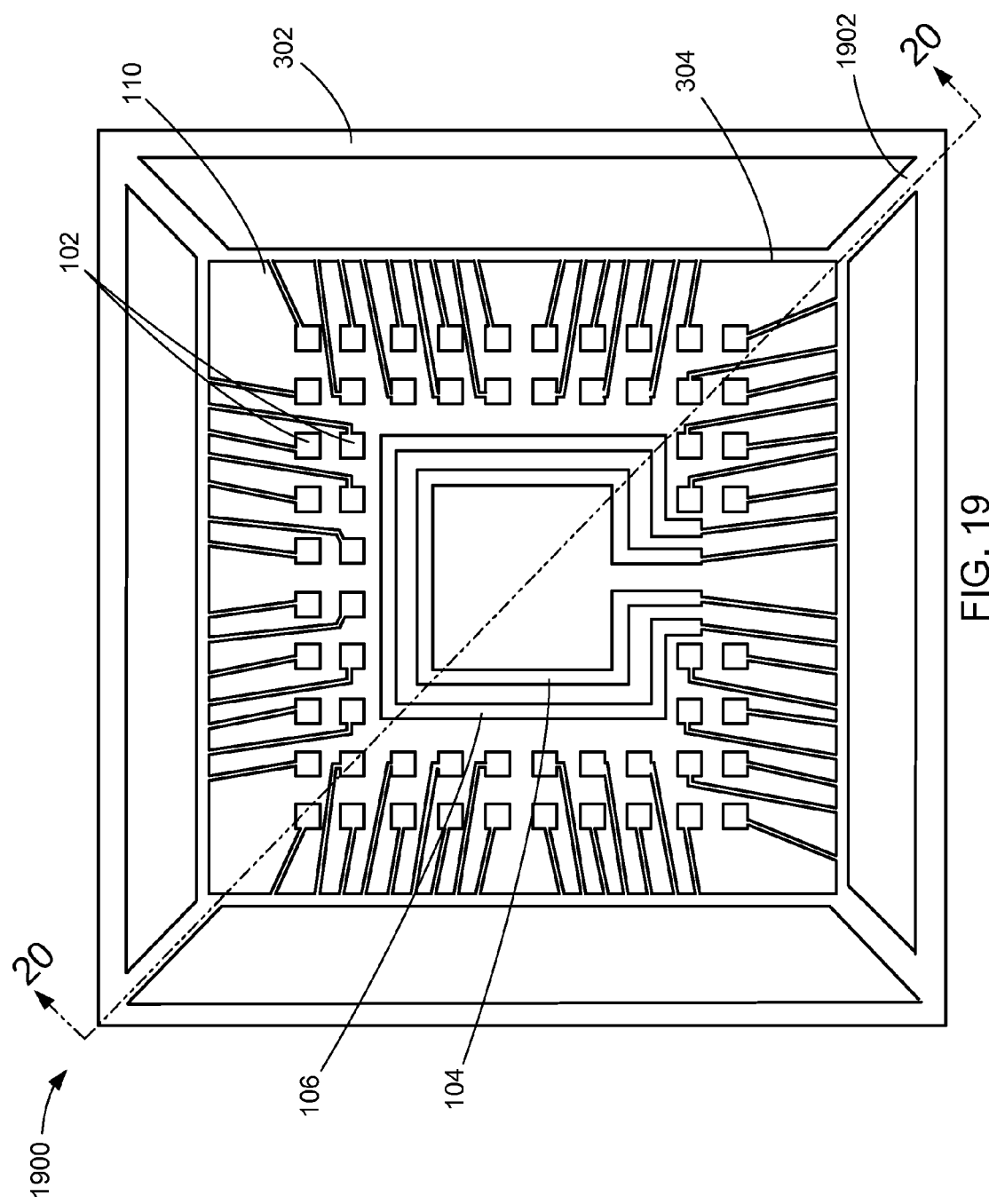
FIG. 19 is a top view of an unfinished encapsulant interposer of a tenth embodiment of the present invention after an intermediate stage of the process.

Referring now to FIG. 19, therein is shown a top view of an unfinished encapsulant interposer 1900 of a tenth embodiment of the present invention after an intermediate stage of the process.

The unfinished encapsulant interposer 1900 is shown. The unfinished encapsulant interposer 1900 has the contact pad 102, the first inductor 104, the second inductor 106, the first dam bar 302, the second dam bar 304, and a connect bar 1902.

The contact pad 102 is connected to the second dam bar 304. The first inductor 104 and the second inductor 106 are also connected to the second dam bar 304. The connect bar 1902 connects the first dam bar 302 to the second dam bar 304.

The contact pad 102, the first inductor 104, and the second inductor 106 are encapsulated in the mold compound 110.

In the current embodiment of the present invention, the first inductor 104 and the second inductor 106, both of which are passive devices, are included in the unfinished encapsulant interposer 1900. It has been discovered that such a configuration saves space that is reserved for such passive devices in conventional semiconductor packages, resulting in denser and more compact semiconductor packages. Furthermore, since the inclusion of the inductors in the encapsulant interposer makes the manufacturing process of semiconductor packages having such passive devices much simpler than the convention manufacturing process, it has also been discovered that such a configuration reduces the cost of manufacturing process. It has further been discovered that the inductor performance in this configuration is improved compared to inductors in conventional semiconductor packages because the inductors are protected from leakage due to the encapsulation by the mold compound 110.

After this intermediate stage of the process, the first dam bar 302 and the second dam bar 304 will be eliminated by a process of singulation. After the stage of singulation, the connect bar will be formed to a predetermined shape.

Figure 20:
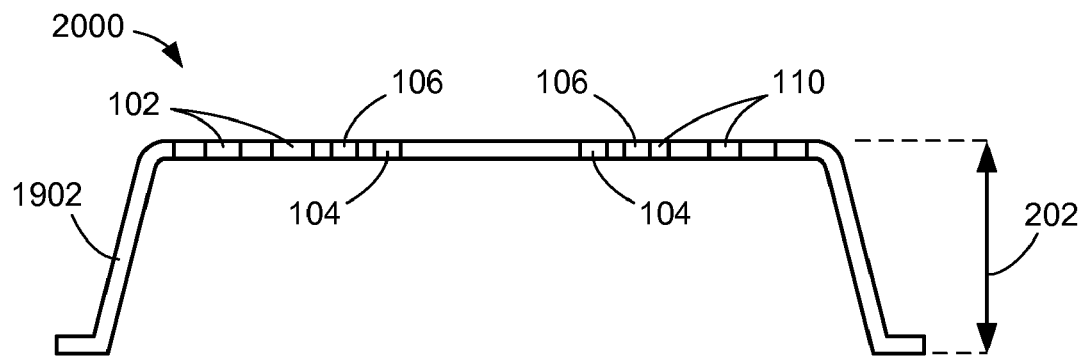
FIG. 20 is a cross-sectional view similar to FIG. 2 of the unfinished encapsulant interposer of the tenth embodiment of the present invention along line 20-20 of FIG. 19 after a stage of singulation.

Referring now to FIG. 20, therein is shown a cross-sectional view similar to FIG. 2 of the unfinished encapsulant interposer 1900 of the tenth embodiment of the present invention along line 20-20 of FIG. 19 after a stage of singulation.

An encapsulant interposer 2000 is shown after the stage of singulation. The connect bar 1902 is not coplanar with the contact pad 102. The connect bar 1902 bends downward and is not horizontal. The standoff height 202 is created between one end of the connect bar 1902 and the contact pad 102 in the vertical direction.

The mold compound 110 provides mechanical support to the first inductor 104, the second inductor 106, and the devices that would be put upon the encapsulant interposer later on. In the current embodiment of the present invention, both the top and the bottom surfaces of the first inductor 104 and the second inductor 106 are exposed.

Figure 21:
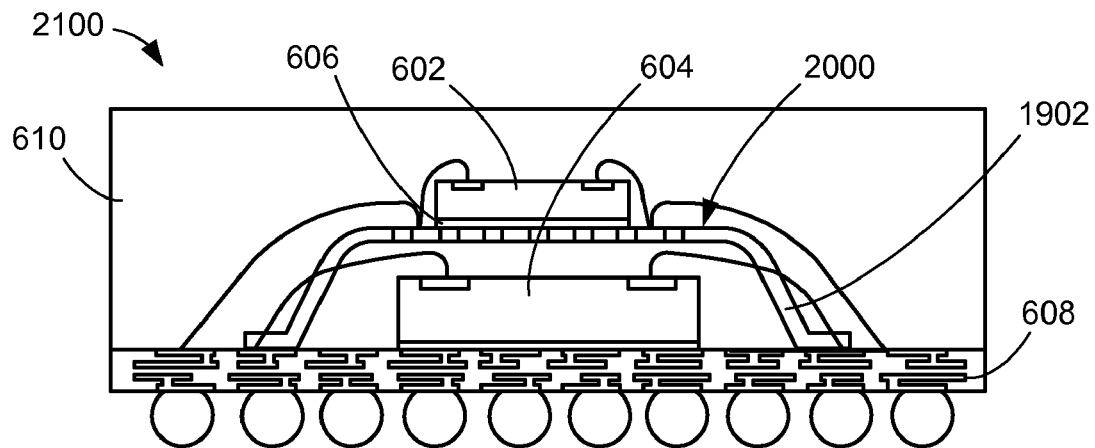
FIG. 21 is a cross-sectional view similar to FIG. 6 of a semiconductor package of an eleventh embodiment of the present invention after a stage of singulation.

Referring now to FIG. 21, therein is shown a cross-sectional view similar to FIG. 6 of a semiconductor package 2100 of an eleventh embodiment of the present invention after a stage of singulation.

The semiconductor package 2100 has the first die 602 and the second die 604. The semiconductor package 2100 also has the encapsulant interposer 2000 embedded. The first die 602 is attached to the encapsulant interposer 2000 through the die paste 606. The second die 604 is underneath the encapsulant interposer 2000 and is attached to the substrate interposer 608.

The encapsulant interposer 2000 having the connect bar 1902, the first die 602, the second die 604, and the die paste 606 are encapsulated in the package mold compound 610.

In the current embodiment of the present invention, the encapsulant interposer 2000 is used as an internal stacking module of the semiconductor package 2100. It has been discovered that such a configuration reduces the thickness of the semiconductor package 2100, resulting in thinner profile of such packages.

Figure 22:
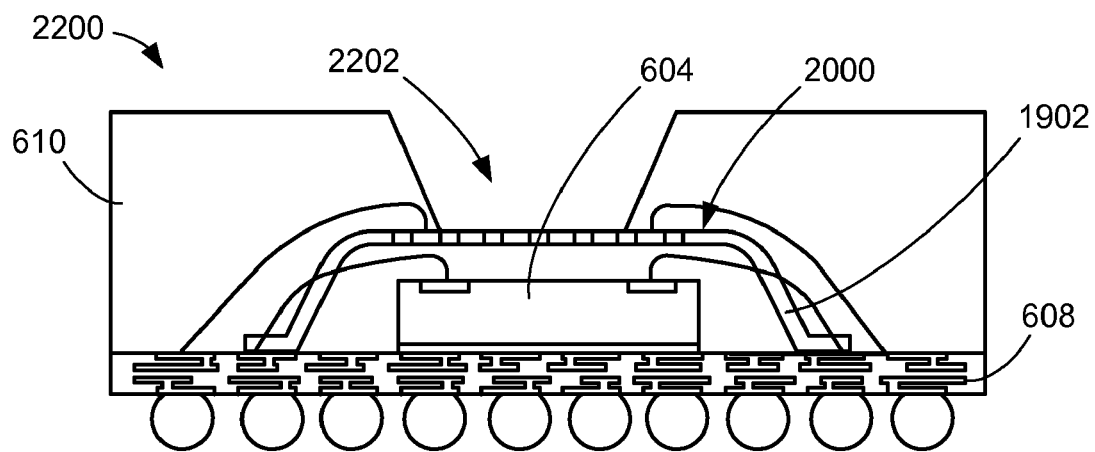
FIG. 22 is a cross-sectional view similar to FIG. 6 of a semiconductor package of a twelfth embodiment of the present invention after a stage of singulation.

Referring now to FIG. 22, therein is shown a cross-sectional view similar to FIG. 6 of a semiconductor package 2200 of a twelfth embodiment of the present invention after a stage of singulation.

The semiconductor package 2200 has the second die 604. The semiconductor package 2200 also has the encapsulant interposer 2000 embedded. The second die 604 is underneath the encapsulant interposer 2000 and is attached to the substrate interposer 608.

The encapsulant interposer 2000 having the connect bar 1902 and the second die 604 are encapsulated in the package mold compound 610. The encapsulation process is done in a way that the top surfaces of the first inductor 104 and the second inductor 106 of the encapsulant interposer 2000 are exposed through a package mold compound opening 2202. The package mold compound opening 2202 allows other semiconductor chips to be connected to the encapsulant interposer 2000, resulting in formation of Fan-in Package-on-Package (Fi-PoP) packages.

In the current embodiment of the present invention, the encapsulant interposer 2000 is used as an internal stacking module of the semiconductor package 2200. It has been discovered that such a configuration reduces the thickness of the semiconductor package 2200, resulting in thinner profile of such packages.

Figure 23:
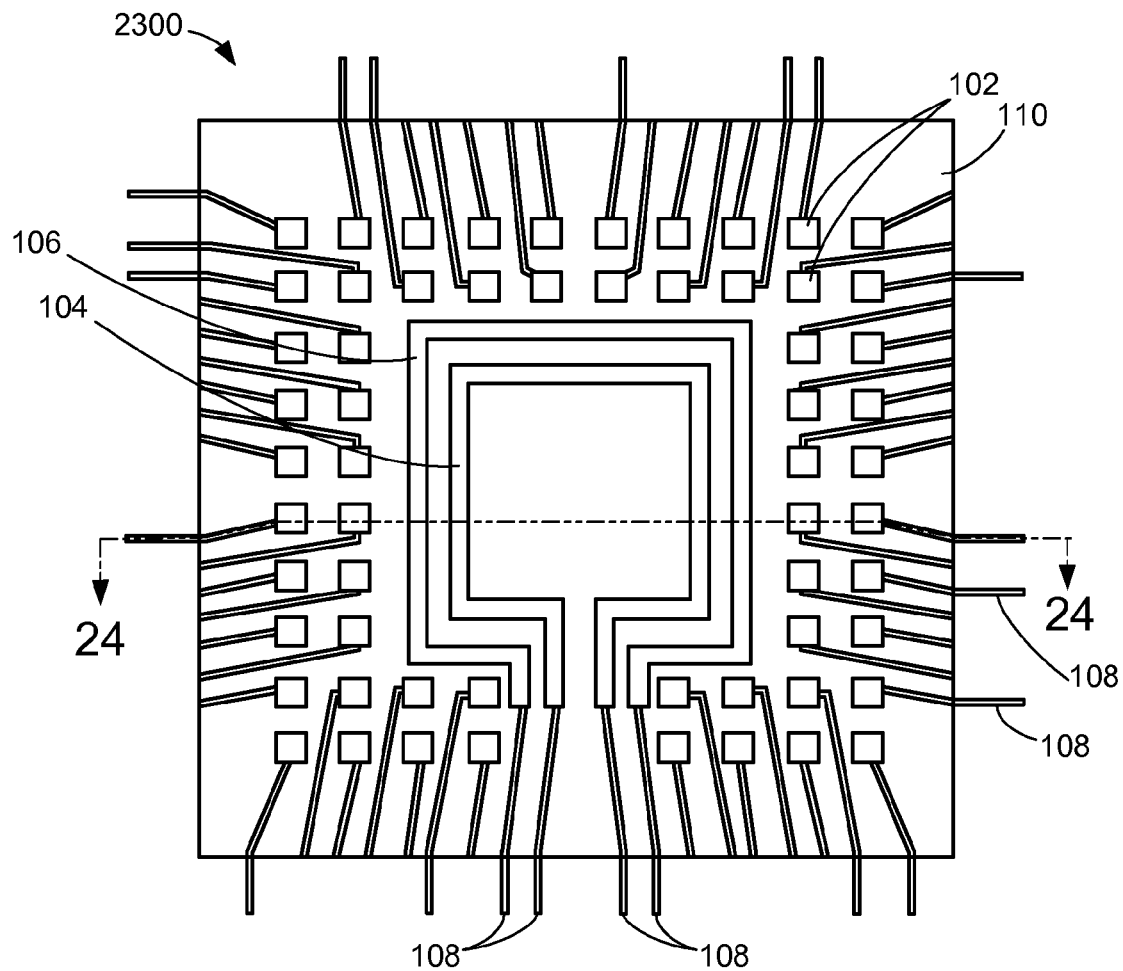
FIG. 23 is a top view of an encapsulant interposer of a thirteenth embodiment of the present invention after a stage of singulation.

Referring now to FIG. 23, therein is shown a top view of an encapsulant interposer 2300 of a thirteenth embodiment of the present invention after a stage of singulation.

An encapsulant interposer 2300 is shown. The encapsulant interposer 2300 has the contact pad 102, the first inductor 104, the second inductor 106, and the external contact terminal 108. A selected number of the contact pad 102 is connected to the external contact terminal 108. The first inductor 104 and the second inductor 106 are also connected to the external contact terminal 108.

The contact pad 102, the first inductor 104, and the second inductor 106 are encapsulated in the mold compound 110.

In the current embodiment of the present invention, the selected number of the contact pad 102 that is connected to the external contact terminal 108 is the contact pad 102 that usually carried ground/power signals.

In the current embodiment of the present invention, the first inductor 104 and the second inductor 106, both of which are passive devices, are included in the encapsulant interposer 2300. It has been discovered that such a configuration saves space that is reserved for such passive devices in conventional semiconductor packages, resulting in denser and more compact semiconductor packages. Furthermore, since the inclusion of the inductors in the encapsulant interposer makes the manufacturing process of semiconductor packages having such passive devices much simpler than the convention manufacturing process, it has also been discovered that such a configuration reduces the cost of manufacturing process. It has further been discovered that the inductor performance in this configuration is improved compared to inductors in conventional semiconductor packages because the inductors are protected from leakage due to the encapsulation by the mold compound 110.

Figure 24:
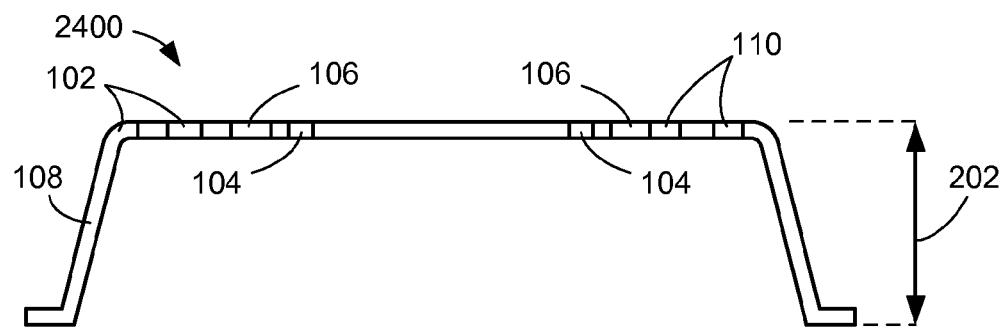
FIG. 24 is a cross-sectional view similar to FIG. 2 of the encapsulant interposer of the thirteenth embodiment of the present invention along line 24-24 of FIG. 23.

Referring now to FIG. 24, therein is shown a cross-sectional view similar to FIG. 2 of the encapsulant interposer 2300 of the thirteenth embodiment of the present invention along line 24-24 of FIG. 23.

The external contact terminal 108 is not coplanar with the contact pad 102. The external contact terminal 108 bends downward and is not horizontal. The standoff height 202 is created between one end of the external contact terminal 108 and the contact pad 102 in the vertical direction.

The mold compound 110 provides mechanical support to the first inductor 104, the second inductor 106, and the devices that would be put upon the encapsulant interposer later on. In the current embodiment of the present invention, both the top and the bottom surfaces of the first inductor 104 and the second inductor 106 are exposed.

Figure 25:
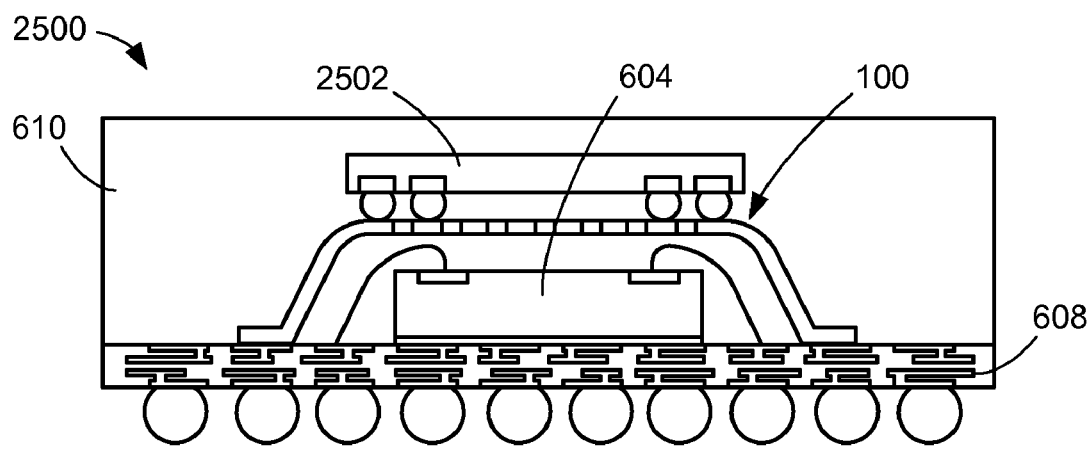
FIG. 25 is a cross-sectional view similar to FIG. 6 of a semiconductor package of a fourteenth embodiment of the present invention after a stage of singulation.

Referring now to FIG. 25, therein is shown a cross-sectional view similar to FIG. 6 of a semiconductor package 2500 of a fourteenth embodiment of the present invention after a stage of singulation.

The semiconductor package 2500 has a first type flip chip die 2502 and the second die 604. The first type flip chip die 2502 includes a pair of connectors adjacent a side of the first type flip chip die 2502 and another pair of connectors adjacent an opposite side a side of the first type flip chip die 2502. The semiconductor package 2500 also has the encapsulant interposer 100 embedded. The first type flip chip die 2502 is attached to the encapsulant interposer 100. The second die 604 is underneath the encapsulant interposer 100 and is attached to the substrate interposer 608.

The encapsulant interposer 100, the first type flip chip die 2502, and the second die 604 are encapsulated in the package mold compound 610.

In the current embodiment of the present invention, the encapsulant interposer 100 is used as an internal stacking module of the semiconductor package 2500. It has been discovered that such a configuration reduces the thickness of the semiconductor package 2500, resulting in thinner profile of such packages.

Figure 26:
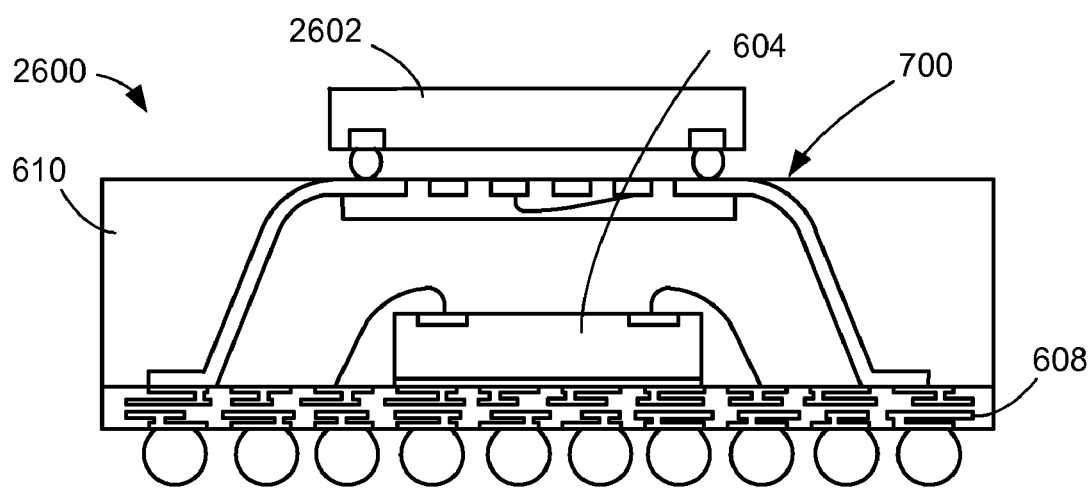
FIG. 26 is a cross-sectional view similar to FIG. 6 of a semiconductor package of a fifteenth embodiment of the present invention after a stage of singulation.

Referring now to FIG. 26, therein is shown a cross-sectional view similar to FIG. 6 of a semiconductor package 2600 of a fifteenth embodiment of the present invention after a stage of singulation.

The semiconductor package 2600 has a second type flip chip die 2602 and the second die 604. The second type flip chip die 2602 includes a single connector adjacent a side of the second type flip chip die 2602 and another of a single connector adjacent an opposite side of the second type flip chip die 2602. The semiconductor package 2600 also has the encapsulant interposer 700 embedded. The second die 604 is underneath the encapsulant interposer 700 and is attached to the substrate interposer 608.

The encapsulant interposer 700 and the second die 604 are encapsulated in the package mold compound 610. The encapsulation process is done in a way that the top surface of the encapsulant interposer 700 is exposed and is not covered by the package mold compound 610. The second type flip chip die 2602 is attached to the encapsulant interposer 700 through the exposed top surface of the encapsulant interposer 700. The difference between the first type flip chip die 2502 in FIG. 25 and the second type flip chi die 2602 is that the first type flip chip die 2502 in FIG. 25 is fully encapsulated by the package mold compound 610 while the second type flip chip die 2602 is not.

In the current embodiment of the present invention, the encapsulant interposer 700 is used as an internal stacking module of the semiconductor package 2600. It has been discovered that such a configuration reduces the thickness of the semiconductor package 2600, resulting in thinner profile of such packages.

Figure 27:
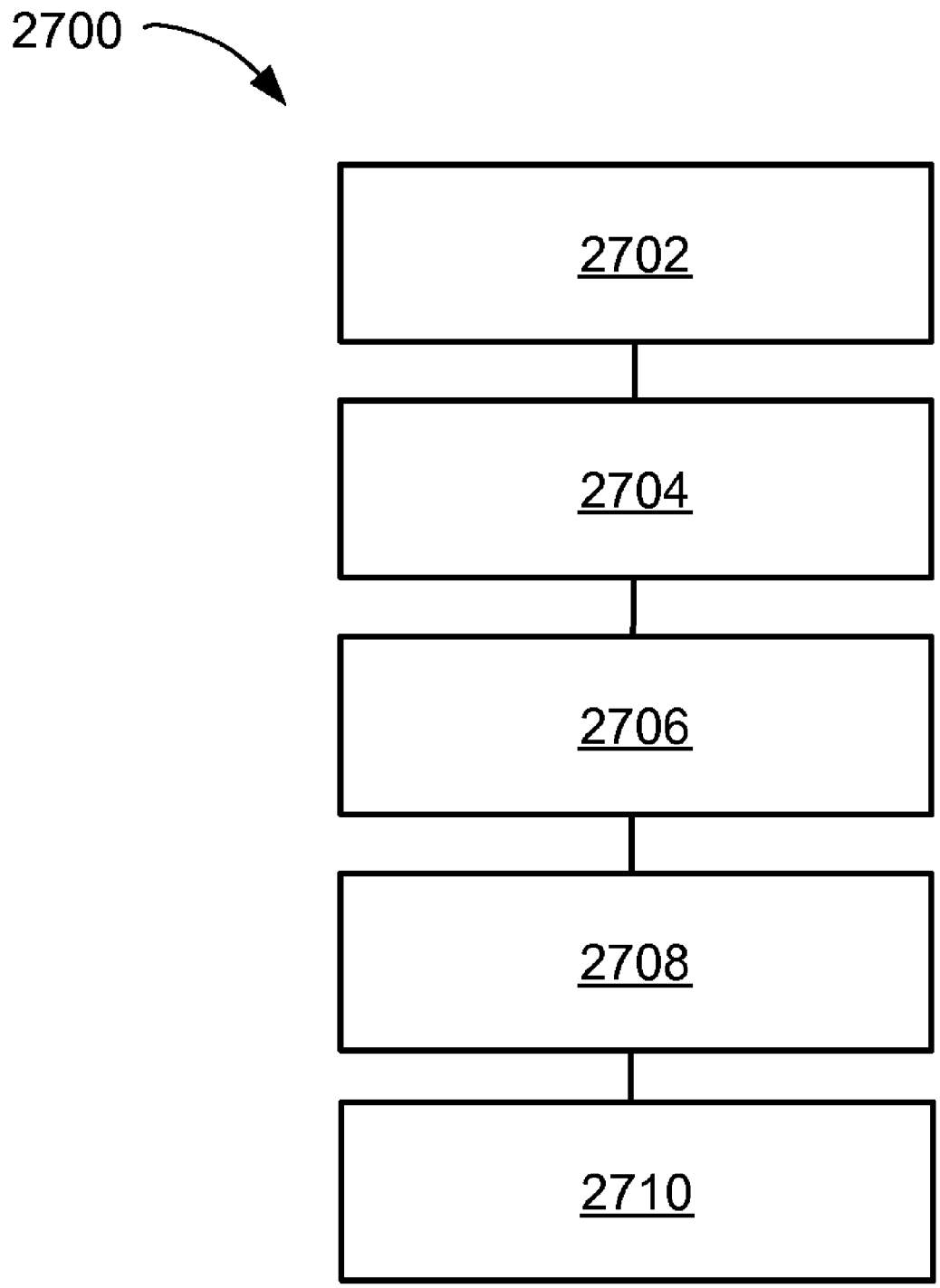
FIG. 27 is a flow chart disclosing a method of manufacturing of a semiconductor package system in a further embodiment of the present invention.

Referring now to FIG. 27, therein is shown a flow chart disclosing a method 2700 of manufacturing of the semiconductor package system in a further embodiment of the present invention. The method 2700 includes forming a leadframe having a passive device in a block 2702; encapsulating the passive device to form an encapsulant interposer in a block 2704; attaching a first die to the encapsulant interposer in a block 2706; forming a substrate interposer having a second die in a block 2708; and stacking the encapsulant interposer over the substrate interposer in a block 2710.

It is discovered that the present invention reduces semiconductor package thickness by using an encapsulant interposer integrated with passive devices as an internal stacking module; saves space that is reserved for passive devices in conventional semiconductor packages, resulting in denser and more compact semiconductor packages; reduces the cost of manufacturing because the inclusion of the passive devices in the encapsulant interposer makes the manufacturing process of semiconductor packages having such passive devices much simpler than the convention manufacturing process; improves inductor performance compared to inductors in conventional semiconductor packages because the inductors are protected from leakage due to the encapsulation by the mold compound.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A semiconductor package system comprising:
    an encapsulant interposer having a passive device encapsulated with both the top and the bottom surfaces of the passive device exposed;
    a first die connected to the encapsulant interposer; and
    a substrate interposer having a second die, the encapsulant interposer being stacked over the substrate interposer.

2. The system as claimed in claim 1 wherein the encapsulant interposer having a passive device encapsulated has a connect bar bent to a predetermined shape.

3. The system as claimed in claim 1 further comprising:
    a package mold compound encapsulating the encapsulant interposer, the first die, and the second die.

4. The system as claimed in claim 3 wherein the first die is electrically connected to the substrate interposer through a bonding wire.

5. The system as claimed in claim 3 wherein the package mold compound has a package mold compound opening, exposing the top surface of the encapsulant interposer.

6. The system as claimed in claim 3 wherein the first die is a first type flip chip die.

7. The system as claimed in claim 3 wherein the first die is a second type flip chip die.

* * * * *